United States Patent
Liao et al.

(10) Patent No.: US 7,126,267 B2
(45) Date of Patent: Oct. 24, 2006

(54) TANDEM OLED HAVING STABLE INTERMEDIATE CONNECTORS

(75) Inventors: Liang-Sheng Liao, Rochester, NY (US); Ching W. Tang, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 97 days.

(21) Appl. No.: 10/857,516

(22) Filed: May 28, 2004

(65) Prior Publication Data

US 2005/0264174 A1 Dec. 1, 2005

(51) Int. Cl.
H01L 27/32 (2006.01)
H01L 51/50 (2006.01)
(52) U.S. Cl. .................. 313/500; 313/503; 313/506
(58) Field of Classification Search ........... 313/503
See application file for complete search history.

(56) References Cited

U.S. PATENT DOCUMENTS

| | | | |
|---|---|---|---|
| 4,769,292 A | | 9/1988 | Tang et al. |
| 5,739,545 A | * | 4/1998 | Guha et al. .................. 257/40 |
| 6,107,734 A | | 8/2000 | Tanaka et al. |
| 6,249,085 B1 | * | 6/2001 | Arai ............................ 313/506 |
| 6,337,492 B1 | * | 1/2002 | Jones et al. .................... 257/40 |
| 6,717,358 B1 | | 4/2004 | Liao et al. |
| 6,791,258 B1 | * | 9/2004 | Haase et al. .................. 313/501 |
| 6,838,836 B1 | * | 1/2005 | Seo et al. .................. 315/169.3 |
| 2002/0109458 A1 | * | 8/2002 | Pichler et al. ............... 313/504 |
| 2002/0155319 A1 | * | 10/2002 | Kawamura et al. ......... 428/690 |
| 2003/0170491 A1 | | 9/2003 | Liao et al. |
| 2003/0189401 A1 | | 10/2003 | Kido et al. |
| 2004/0188690 A1 | * | 9/2004 | Noguchi ....................... 257/79 |
| 2005/0123793 A1 | * | 6/2005 | Thompson et al. ......... 428/690 |

FOREIGN PATENT DOCUMENTS

JP 2003045676 A 2/2003

OTHER PUBLICATIONS

Tang et al., "Electroluminescence of doped organic thin films", *Journal of Applied Physics*, 65, 3610 (1989).
Adachi et al., "Electroluminescence in Organic Films with Three-Layer Structure", *Japanese Journal of Applied Physics*, 27, L269 (1988).
Kido et al., "High Efficiency Organic EL Devices having Charge Generation Layers", *SID 03 Digest*, 964 (2003).
Liao et al., "High-efficiency tandem organic light-emitting diodes", *Applied Physics Letters*, 84, 167 (2004).
Tang et al., "Organic electroluminescent diodes", *Applied Physics Letters*, 51, 913 (1987).
L.F. Chang et al.; Effect of Deposition Rate On The Morphology, Chemistry and Electroluminescence of Tris-(8-Hydroxyquinoline) Aluminum Films; Mar. 17, 2000; pp. 418-422.

* cited by examiner

*Primary Examiner*—Mariceli Santiago
*Assistant Examiner*—Anne M Hines
(74) *Attorney, Agent, or Firm*—Raymond L. Owens

(57) ABSTRACT

A tandem OLED includes an anode, a cathode, and a plurality of organic electroluminescent units disposed between the anode and the cathode, wherein each organic electroluminescent unit includes at least one light-emitting layer, and an intermediate connector disposed between each adjacent organic electroluminescent unit, wherein the intermediate connector includes at least a high work function metal layer having a work function of no less than 4.0 eV and a metal compound layer, wherein the intermediate connector has a sheet resistance of higher than 100 kΩ per square, and wherein the high work function metal layer improves the operational stability of the OLED.

28 Claims, 3 Drawing Sheets

TANDEM OLED HAVING STABLE INTERMEDIATE CONNECTORS

CROSS REFERENCE TO RELATED APPLICATIONS

Reference is made to commonly assigned U.S. patent application Ser. No. 10/437,195 filed May 13, 2003 entitled "Cascaded Organic Electroluminescent Device Having Connecting Units with n-Type and p-Type Organic Layers" by Liao et al., the disclosure of which is herein incorporated by reference.

FIELD OF INVENTION

The present invention relates to providing a plurality of organic electroluminescent (EL) units to form a tandem (or cascaded, or stacked) organic electroluminescent device.

BACKGROUND OF THE INVENTION

Organic electroluminescent (EL) devices, or organic light-emitting diodes (OLEDs), are electronic devices that emit light in response to an applied potential. The structure of an OLED comprises, in sequence, an anode, an organic EL medium, and a cathode. The organic EL medium disposed between the anode and the cathode is commonly comprised of an organic hole-transporting layer (HTL) and an organic electron-transporting layer (ETL). Holes and electrons recombine and emit light in the ETL near the interface of HTL/ETL. Tang et al., "Organic electroluminescent diodes", *Applied Physics Letters*, 51, 913 (1987), and commonly assigned U.S. Pat. No. 4,769,292, demonstrated highly efficient OLEDs using such a layer structure. Since then, numerous OLEDs with alternative layer structures have been disclosed. For example, there are three-layer OLEDs that contain an organic light-emitting layer (LEL) between the HTL and the ETL, such as that disclosed by Adachi et al., "Electroluminescence in Organic Films with Three-Layer Structure", *Japanese Journal of Applied Physics*, 27, L269 (1988), and by Tang et al., "Electroluminescence of doped organic thin films", *Journal of Applied Physics*, 65, 3610 (1989). The LEL commonly includes of a host material doped with a guest material wherein the layer structures are denoted as HTL/LEL/ETL. Further, there are other multilayer OLEDs that contain a hole-injecting layer (HIL), and/or an electron-injecting layer (EIL), and/or a hole-blocking layer, and/or an electron-blocking layer in the devices. These structures have further resulted in improved device performance.

Moreover, in order to further improve the performance of the OLEDs, a new kind of OLED structure called tandem OLED (or stacked OLED, or cascaded OLED), which is fabricated by stacking several individual OLEDs vertically and driven by a single power source, has also been proposed or fabricated by Tanaka et al. U.S. Pat. No. 6,107,734; Jones et al. U.S. Pat. No. 6,337,492; Kido et al. JP Patent Publication 2003045676A and U.S. Patent Publication 2003/0189401 A1; Liao et al. U.S. Pat. No. 6,717,358, U.S. Patent Application Publication 2003/0170491 A1, and commonly assigned U.S. patent application Ser. No. 10/437,195 filed May 13, 2003 entitled "Cascaded Organic Electroluminescent Device Having Connecting Units with n-Type and p-Type Organic Layers", the disclosure of which is herein incorporated by reference. For example, Tanaka et al., U.S. Pat. No. 6,107,734, demonstrated a 3-EL-unit tandem OLED using In—Zn—O (IZO) films or Mg:Ag/IZO films as intermediate connectors and achieved a luminous efficiency of 10.1 cd/A from pure tris(8-hydroxyquinoline)aluminum emitting layers. Kido et al., "High Efficiency Organic EL Devices having Charge Generation Layers", *SID 03 Digest*, 964 (2003), fabricated 3-EL-unit tandem OLEDs using In—Sn—O (ITO) films or $V_2O_5$ films as intermediate connectors and achieved a luminous efficiency of up to 48 cd/A from fluorescent dye doped emitting layers. Liao et al., "High-efficiency tandem organic light-emitting diodes", *Applied Physics Letters*, 84, 167 (2004), demonstrated a 3-EL-unit tandem OLED using doped organic "p-n" junction layers as intermediate connectors and achieved a luminous efficiency of 136 cd/A from phosphorescent dye doped emitting layers.

Using organic "p-n" junction as an intermediate connector is effective for optical out-coupling and for easy fabrication of devices. However, it is also necessary to use inorganic intermediate connectors in tandem OLEDs as an alternative method. Therefore, searching for a stable inorganic intermediate connector is still needed.

Using IZO or ITO film as intermediate connector will have high lateral conductivity resulting in pixel crosstalk problems. Moreover, the fabrication of IZO and ITO films requires sputtering that can cause damage on the underlying organic layers. Although using $V_2O_5$ film as intermediate connector can limit pixel crosstalk, $V_2O_5$ has been classified as a highly toxic substance (see Aldrich Catalogue, for example) and is difficult to be thermally evaporated as well.

SUMMARY OF THE INVENTION

It is an object of the present invention to make tandem OLEDs using nontoxic materials.

It is another object of the present invention to make tandem OLEDs with improved operational stability.

It is yet another object of the present invention to make tandem OLEDs with improved drive voltage.

It is a further object of the present invention to make tandem OLEDs with improved power efficiency.

It is a still further object of the present invention to make tandem OLEDs with improved optical transparency.

These objects are achieved by a tandem OLED comprising:
  a) an anode;
  b) a cathode;
  c) a plurality of organic electroluminescent units disposed between the anode and the cathode, wherein each organic electroluminescent unit includes at least one light-emitting layer; and
  d) an intermediate connector disposed between each adjacent organic electroluminescent unit, wherein the intermediate connector includes at least a high work function metal layer having a work function of no less than 4.0 eV and a metal compound layer, wherein the intermediate connector has a sheet resistance of higher than 100 kΩ per square, and wherein the high work function metal layer improves the operational stability of the OLED.

ADVANTAGEOUS EFFECT OF THE INVENTION

An advantage of the present invention is that the materials used for the fabrication of the tandem OLED can be nontoxic. This will be important for the wide applications of the OLED.

Another advantage of the present invention is that by using a thin layer (as thin as 0.2 nm) of high work function metal in the intermediate connector, the operational stability of the tandem OLED can be improved.

Yet another advantage of the present invention is that by using the intermediate connector with a thin layer of high work function metal, the drive voltage of the tandem OLED can be reduced. As a result, the power efficiency of the tandem OLED can be increased.

A further advantage of the present invention is that the intermediate connector can be as thin as about 2 nm, thereby enabling a good optical transmission in the tandem OLED.

A still further advantage of the present invention is that all the layers used for the construction of the tandem OLED can be prepared within a same vacuum chamber with a thermal evaporation method, thereby enabling low fabrication cost and high production yield.

It will be understood that FIGS. 1–5 are not to scale since the individual layers are too thin and the thickness differences of various layers too great to permit depiction to scale.

DETAILED DESCRIPTION OF THE INVENTION

In commonly assigned U.S. Pat. No. 6,717,358, U.S. Patent Application Publication 2003/0170491 A1, and commonly assigned U.S. patent application Ser. No. 10/437,195 filed May 13, 2003 entitled "Cascaded Organic Electroluminescent Device Having Connecting Units with n-Type and p-Type Organic Layers" by Liao et al., the disclosure of which is herein incorporated by reference, the layer structure of a tandem OLED (or cascaded OLED, or stacked OLED) has been disclosed. The device structure comprises an anode, a cathode, a plurality of organic EL units and a plurality of connecting units (or intermediate connectors thereafter), wherein each of the intermediate connectors is disposed between two organic EL units. In this tandem structure only a single external power source is needed to connect to the anode and the cathode with the positive potential applied to the anode and the negative potential to the cathode. With good optical transparency and charge injection, the tandem OLED exhibits high electroluminescence efficiency.

The present invention constructs a tandem OLED and improves its performance by forming an intermediate connector including at least a high work function metal layer and a metal compound layer in the device.

Figure 1:
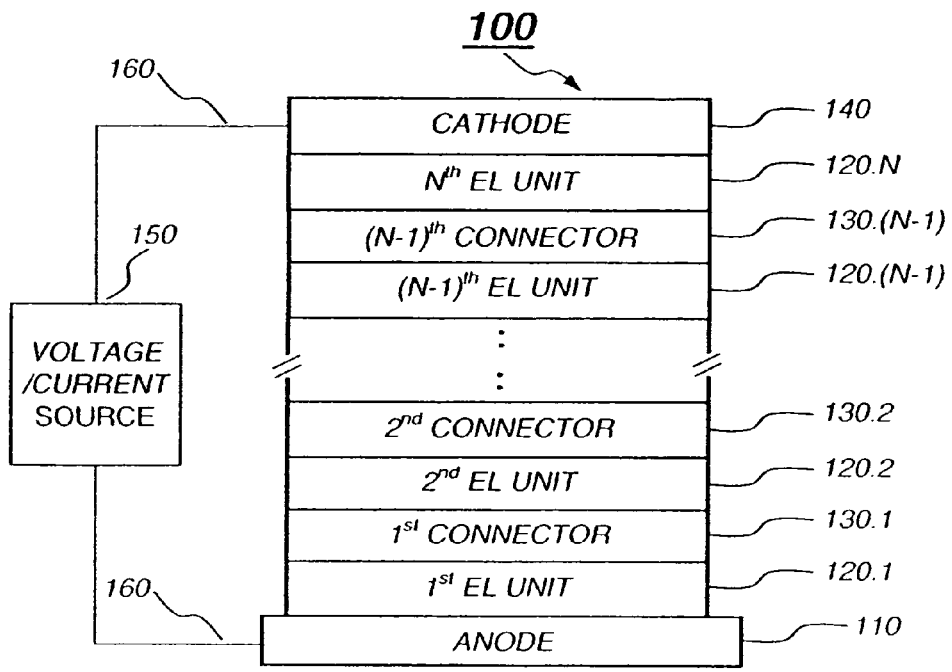
FIG. 1 depicts a schematic cross sectional view of a tandem OLED in accordance with the present invention, having a plurality of organic EL units and having an intermediate connector in between each of the organic EL units.

FIG. 1 shows a tandem OLED 100 in accordance with the present invention. This tandem OLED has an anode 110 and a cathode 140, at least one of which is transparent. Disposed between the anode and the cathode are N organic EL units 120, where N is an integer greater than 1. These organic EL units, stacked serially to each other and to the anode and the cathode, are designated 120.1 to 120.N where 120.1 is the first EL unit (adjacent to the anode) and 120.N is the N$^{th}$ unit (adjacent to the cathode). The term EL unit 120 represents any of the EL units named from 120.1 to 120.N in the present invention. Disposed between any two adjacent organic EL units is an intermediate connector (or connector) 130. There are a total of N-1 intermediate connectors associated with N organic EL units and they are designated 130.1 to 130.(N-1). Intermediate connector 130.1 is disposed between organic EL units 120.1 and 120.2, intermediate connector 130.2 is disposed between organic EL unit 120.2 and the next EL unit, and intermediate connector 130.(N-1) is disposed between organic EL units 120.(N-1) and 120.N. The term intermediate connector 130 represents any of the connectors named from 130.1 to 130.(N-1) in the present invention. The tandem OLED 100 is externally connected to a voltage/current source 150 through electrical conductors 160.

Tandem OLED 100 is operated by applying an electric potential produced by a voltage/current source 150 between a pair of contact electrodes, anode 110 and cathode 140, such that anode 110 is at a more positive potential with respect to the cathode 140. This externally applied electrical potential is distributed among the N organic EL units in proportion to the electrical resistance of each of these units. The electric potential across the tandem OLED causes holes (positively charged carriers) to be injected from anode 110 into the 1$^{st}$ organic EL unit 120.1, and electrons (negatively charged carriers) to be injected from cathode 140 into the N$^{th}$ organic EL unit 120.N. Simultaneously, electrons and holes are produced in, and separated from, each of the intermediate connectors, (130.1–130.(N-1). Electrons thus produced in, for example, intermediate connector 130.(N-1) are injected towards the anode and into the adjacent organic EL unit 120.(N-1). Likewise, holes produced in the intermediate connector 130.(N-1) are injected towards the cathode and into the adjacent organic EL unit 120.N. Subsequently, these electrons and holes recombine in their corresponding organic EL units to produce light, which is observed via the transparent electrode or electrodes of the OLED. In other words, the electrons injected from the cathode are energetically cascading from the N$^{th}$ organic EL unit to the 1$^{st}$ organic EL unit, and emit light in each of the organic EL units.

Figure 2:
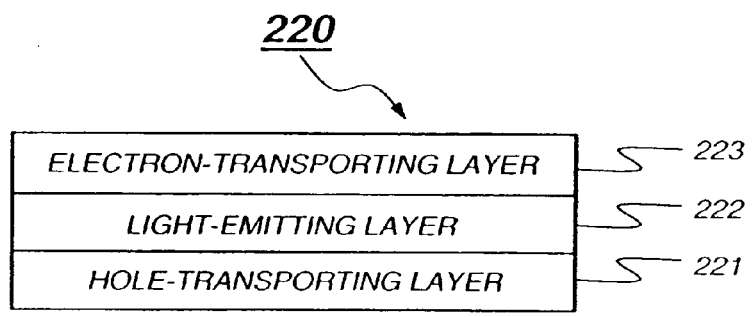
FIG. 2 depicts a schematic cross sectional view of one of the organic EL units, having a layer structure of "HTL/LEL/ETL", in the tandem OLED in accordance with the present invention.

Each organic EL unit 120 in the tandem OLED 100 is capable of supporting hole and electron transport, and electron hole recombination to produce light. Each organic EL unit 120 can comprise a plurality of layers. There are many organic EL multilayer structures known in the art that can be used as the organic EL unit of the present invention. These include HTL/ETL, HTL/LEL/ETL, HIL/HTL/LEL/ETL, HIL/HTL/LEL/ETL/EIL, HIL/HTL/electron-blocking layer or hole-blocking layer/LEL/ETL/EIL, HIL/HTL/LEL/hole-blocking layer/ETL/EIL. Each organic EL unit in the tandem OLED can have the same or different layer structures from other organic EL units. The layer structure of the $1^{st}$ organic EL unit adjacent to the anode preferably is of HIL/HTL/LEL/ETL, and the layer structure of the $N^{th}$ organic EL unit adjacent to the anode preferably is of HTL/LEL/ETL/EIL, and the layer structure of the other organic EL units preferably is of HTL/LEL/ETL. FIG. 2 (EL unit 220) shows one embodiment of the EL unit 120 in the tandem OLED 100 in accordance with the present invention, wherein the EL unit 220 has an HTL 221, a LEL 222, and an ETL 223.

The organic layers in the organic EL units can be formed from small molecule OLED materials or polymeric LED materials, both known in the art, or combinations thereof. The corresponding organic layer in each organic EL unit in the tandem OLED can be the same or different from other corresponding organic layers. Some organic EL units can be polymeric and other units can be of small molecules.

Each organic EL unit can be selected in order to improve performance or achieve a desired attribute, for example, light transmission through the OLED multilayer structure, driving voltage, luminance efficiency, light emission color, manufacturability, device stability, and so forth.

In order to reduce driving voltage for the tandem OLED, it is desirable to make each organic EL unit as thin as possible without compromising the electroluminescence efficiency. It is preferable that each organic EL unit is less than 500 nm thick, and more preferable that it be 2–200 nm thick. It is also preferable that each layer within the organic EL unit be 200 nm thick or less, and more preferable that it be 0.1–100 nm.

The number of organic EL units in the tandem OLED is, in principle, equal to or more than 2. Preferably, the number of the organic EL units in the tandem OLED is such that the luminance efficiency in units of cd/A is improved or maximized. For lamp applications, the number of organic EL units can be determined according to the maximum voltage of the power supply.

As is well known, the conventional OLED comprises an anode, an organic medium, and a cathode. In the present invention, the tandem OLED comprises an anode, a plurality of organic EL units, a plurality of intermediate connectors, and a cathode, wherein the intermediate connector is a new feature for tandem OLEDs.

For a tandem OLED to function efficiently, it is necessary that the intermediate connector should provide good carrier injection into the adjacent organic EL units. Due to their lower resistivity than that of organic materials, metals, metal compounds, or other inorganic compounds can be good for carrier injection. However, low resistivity can cause low sheet resistance resulting in pixel crosstalk. If the lateral current passing through the adjacent pixels to cause pixel crosstalk is limited to less than 10% of the current used to drive a pixel, the lateral resistance of the intermediate connector ($R_{ic}$) should be at least 8 times the resistance of the tandem OLED. Usually, the static resistance between two electrodes of a conventional OLED is about several kΩs, and a tandem OLED should have a resistance of about 10 kΩ or several 10 kΩs between the two electrodes. Therefore $R_{ic}$ should be greater than 100 kΩ. Considering the space between each pixel is smaller than one square, the sheet resistance of the intermediate connector should be then greater than 100 kΩ per square (lateral resistance equals to sheet resistance times the number of square). Because the sheet resistance is determined by both the resistivity and the thickness of the films (sheet resistance equals to film resistivity divided by film thickness), when the layers constituting an intermediate connector are selected from metals, metal compounds, or other inorganic compounds having low resistivity, a sheet resistance of the intermediate connector greater than 100 kΩ per square can still be achievable if the layers are thin enough.

Another requirement for the tandem OLED to function efficiently is that the optical transparency of the layers constituting the organic EL units and the intermediate connectors be as high as possible to permit for radiation produced in the organic EL units to exit the device. According to a simple calculation, if the optical transmission of each intermediate connector is 70% of the emitting light, a tandem OLED will not have much benefit because no matter how many EL units there are in the device, the electroluminance efficiency can never be doubled when comparing to a conventional device. The layers constituting the organic EL units are generally optically transparent to the radiation produced by the EL units, and therefore their transparency is generally not a concern for the construction of the tandem OLEDs. As is known, metals, metal compounds, or other inorganic compounds can have low transparency. However, when the layers constituting an intermediate connector are selected from the metals, metal compounds, or other inorganic compounds, an optical transmission higher than 70% can still be achievable if the layers are thin enough. Preferably, the intermediate connector has at least 75% optical transmission in the visible region of the spectrum.

Figure 3:
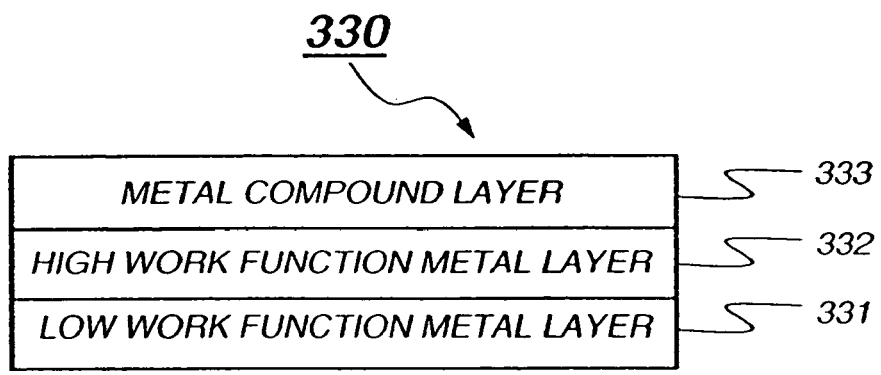
FIG. 3 depicts a schematic cross sectional view of one intermediate connector, having the layer structure of "a low work function metal layer/a high work function metal layer/a metal compound layer", in the tandem OLED in accordance with the present invention.

Therefore, the intermediate connectors provided between adjacent organic EL units are crucial, as they are needed to provide for efficient electron and hole injection into the adjacent organic EL units without causing pixel crosstalk and without compromising the optical transparency. Shown in FIG. 3 is one embodiment of the intermediate connectors in the present invention. Intermediate connector 330 comprises, in sequence, a low work function metal layer 331, a high work function metal layer 332, and a metal compound layer 333. Herein, a low work function metal is defined as a metal having a work function less than 4.0 eV. Likewise, a high work function metal is defined as a metal having a work function no less than 4.0 eV. The low work function metal layer 331 is disposed adjacent to the ETL of an organic EL unit towards the anode side, and the metal compound layer 333 is disposed adjacent to the HTL of another organic EL unit towards the cathode side. The low work function metal layer 331 is selected to provide efficient electron injection into the adjacent electron-transporting layer. The metal compound layer 333 is selected to provide efficient hole injection into the adjacent hole-transporting layer. Preferably, the metal compound layer comprises, but is not limited to, a p-type semiconductor. The high work function metal layer 332 is selected to improve the operational stability of the OLED by preventing a possible interaction or interdiffusion between the low work function layer 331 and the metal compound layer 333.

Figure 4:
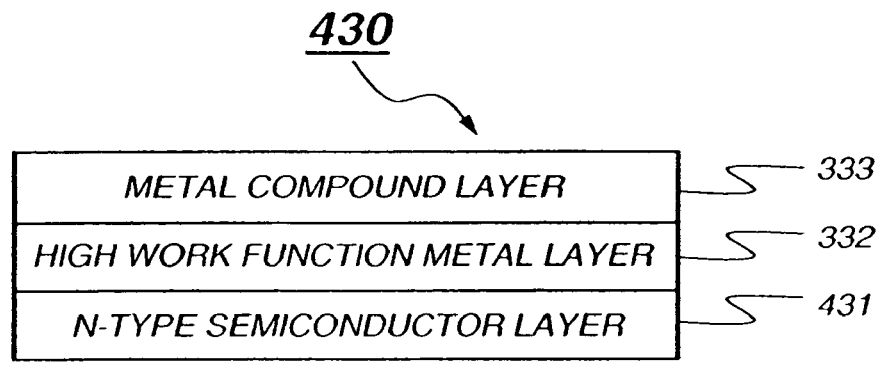
FIG. 4 depicts a schematic cross sectional view of another intermediate connector, having the layer structure of "an n-type semiconductor layer/a high work function metal layer/a metal compound layer", in the tandem OLED in accordance with the present invention.

FIG. 4 shows another embodiment of the intermediate connector in the present invention. Intermediate connector 430 comprises, in sequence, an n-type semiconductor layer 431, a high work function metal layer 332, and a metal compound layer 333. The n-type semiconductor layer 431 is disposed adjacent to the ETL of an organic EL unit towards the anode side, and the metal compound layer 333 is disposed adjacent to the HTL of another organic EL unit towards the cathode side. Herein, an n-type semiconductor layer means that the layer is electrically conductive having electrons as the major charge carriers. Likewise, a p-type semiconductor layer means that the layer is electrically conductive having holes as the major charge carriers. Similar to the low work function metal layer 331 in FIG. 3, the n-type semiconductor layer 431 is selected to provide efficient electron injection into the adjacent electron-transporting layer. The same as in FIG. 3, the metal compound layer 333 is selected to provide efficient hole injection into the adjacent hole-transporting layer, and the high work function metal layer 332 is selected to improve the operational stability of the OLED by preventing a possible interaction or interdiffusion between the n-type semiconductor layer 431 and the metal compound layer 333.

Figure 5:
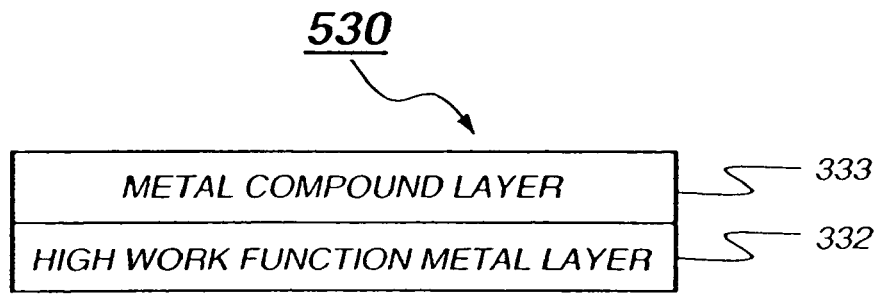
FIG. 5 depicts a schematic cross sectional view of yet another intermediate connector, having the layer structure of "a high work function metal layer/a metal compound layer", in the tandem OLED in accordance with the present invention.

In the case such that the ETL in the EL unit is an n-type doped organic layer, the layer structure of the intermediate connector can be simplified as is shown in FIG. 5 wherein intermediate connector 530 comprises, in sequence, a high work function metal layer 332 disposed adjacent to the n-type doped ETL of an organic EL unit towards the anode side, and a metal compound layer 333 disposed adjacent to the HTL of another organic EL unit towards the cathode side. The metal compound layer 333 is selected to provide efficient hole injection into the adjacent hole-transporting layer, and the high work function metal layer 332 is selected to improve the operational stability of the OLED by preventing a possible interaction or interdiffusion between the n-type doped ETL and the metal compound layer 333. Herein, an n-type doped organic layer means that the layer is electrically conductive, and the charge carriers are primarily electrons. The conductivity is provided by the formation of a charge-transfer complex as a result of electron transfer from the dopant to the host material. Depending on the concentration and the effectiveness of the dopant in donating an electron to the host material, the layer electrical conductivity can change by several orders of magnitude. With an n-type doped organic layer as an ETL in the EL unit, electrons can be efficiently injected from the adjacent intermediate connector into the ETL.

In order for the intermediate connectors to have good optical transmission (at least 75% optical transmission in the visible region of the spectrum), good carrier injection capability, and good operational stability, the thickness of the layers in the intermediate connectors has to be carefully considered. The thickness of the low work function metal layer 331 in the intermediate connectors is in the range of from 0.1 nm to 5.0 nm, preferably in the range of from 0.2 nm to 2.0 nm. The thickness of the high work function metal layer 332 in the intermediate connectors is in the range of from 0.1 nm to 5.0 nm, preferably in the range of from 0.2 nm to 2.0 nm. The thickness of the metal compound layer 333 in the intermediate connectors is in the range of from 0.5 nm to 20 nm, preferably in the range of from 1.0 nm to 5.0 nm. The thickness of the n-type semiconductor layer 431 in the intermediate connectors is in the range of from 0.5 nm to 20 nm, preferably in the range of from 1.0 nm to 5.0 nm.

The materials used for the fabrication of the intermediate connectors are basically selected from nontoxic materials. The low work function metal layer 331 includes Li, Na, K, Rb, Cs, Mg, Ca, Sr, Ba, La, Ce, Nd, Sm, Eu, Tb, Dy, or Yb. Preferably, the low work function metal layer 331 includes Li, Na, Cs, Ca, Ba, or Yb.

The high work function metal layer 332 includes Ti, Zr, Ti, Nb, Ta, Cr, Mo, W, Re, Fe, Ru, Os, Co, Rh, Ir, Ni, Pd, Pt, Cu, Ag, Au, Zn, Al, In, or Sn. Preferably, the high work function metal layer 332 includes Ag, Al, Cu, Au, Zn, In, or Sn. More preferably, the high work function metal layer 332 includes Ag or Al.

The metal compound layer 333 can be selected from the stoichiometric oxides or nonstoichiometric oxides of titanium, zirconium, hafnium, niobium, tantalum, molybdenum, tungsten, manganese, iron, ruthenium, rhodium, iridium, nickel, palladium, platinum, copper, zinc, silicon, or germanium, or combinations thereof. The metal compound layer 333 can be selected from the stoichiometric sulfides or nonstoichiometric sulfides of titanium, zirconium, hafnium, niobium, tantalum, molybdenum, tungsten, manganese, iron, ruthenium, rhodium, iridium, nickel, palladium, platinum, copper, silicon, or germanium, or combinations thereof. The metal compound layer 333 can be selected from the stoichiometric selenides or nonstoichiometric selenides of titanium, zirconium, hafnium, niobium, tantalum, molybdenum, tungsten, manganese, iron, ruthenium, rhodium, iridium, nickel, palladium, platinum, copper, silicon, or germanium, or combinations thereof. The metal compound layer 333 can be selected from the stoichiometric tellurides or nonstoichiometric tellurides of titanium, zirconium, haffiium, niobium, tantalum, molybdenum, tungsten, manganese, iron, ruthenium, rhodium, iridium, nickel, palladium, platinum, copper, silicon, or germanium, or combinations thereof. The metal compound layer 333 can be selected from the stoichiometric nitrides or nonstoichiometric nitrides of titanium, zirconium, hafnium, niobium, tantalum, molybdenum, tungsten, manganese, iron, ruthenium, rhodium, iridium, nickel, palladium, platinum, copper, zinc, gallium, silicon, or germanium, or combinations thereof. The metal compound layer 333 can also be selected from the stoichiometric carbides or nonstoichiometric carbides of titanium, zirconium, hafnium, niobium, tantalum, molybdenum, tungsten, manganese, iron, ruthenium, rhodium, iridium, nickel, palladium, platinum, copper, zinc, aluminum, silicon, or germanium, or combinations thereof.

The metal compound layer 333 can be selected from $MoO_3$, $NiMoO_4$, $CuMoO_4$, $WO_3$, $ZnTe$, $Al_4C_3$, $AlF_3$, $B_2S_3$, $CuS$, $GaP$, $InP$, or $SnTe$. Preferably, the metal compound layer 333 is selected from $MoO_3$, $NiMoO_4$, $CuMoO_4$, or $WO_3$.

The n-type semiconductor layer 431 includes, but is not limited to, $ZnSe$, $ZnS$, $ZnSSe$, $SnSe$, $SnS$, $SnSSe$, $LaCuO_3$, or $La_4Ru_6O_{19}$. Preferably, the n-type semiconductor layer 431 includes $ZnSe$ or $ZnS$.

The intermediate connectors can be produced by thermal evaporation, electron beam evaporation, or ion sputtering technique. Preferably, a thermal evaporation method is used for the deposition of all the materials in the fabrication of the tandem OLED including the intermediate connectors.

The tandem OLED of the present invention is typically provided over a supporting substrate where either the cathode or anode can be in contact with the substrate. The electrode in contact with the substrate is conveniently referred to as the bottom electrode. Conventionally, the bottom electrode is the anode, but the present invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing, or light reflective. Substrates for use in this case include, but are not limited to, glass, plastic, semiconductor materials, silicon, ceramics, and circuit board materials. Of course, it is necessary to provide in these device configurations a light-transparent top electrode.

When EL emission is viewed through anode 110, the anode should be transparent, or substantially transparent, to the emission of interest. Common transparent anode materials used in the present invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, and metal selenides such as zinc selenide, and metal sulfides such as zinc sulfide, can be used as the anode. For applications where EL emission is viewed only through the cathode electrode, the transmissive characteristics of the anode are immaterial and any conductive material can be used, regardless if it is transparent, opaque, or reflective. Example conductors for this application include, but are not limited to, gold, iridium, molybdenum, palladium, and platinum. Typical anode materials, transmissive or otherwise, have a work function no less than 4.0 eV. Desired anode materials are commonly deposited by any suitable way such as evaporation, sputtering, chemical vapor deposition, or electrochemical means. Anodes can be patterned using well known photolithographic processes. Optionally, anodes can be polished prior to the deposition of other layers to reduce surface roughness so as to reduce electrical shorts or enhance reflectivity.

While not always necessary, it is often useful to provide an HIL in the organic EL unit. The HIL can serve to improve the film formation property of subsequent organic layers and to facilitate injection of holes into the HTL reducing the driving voltage of the tandem OLED. Suitable materials for use in the HIL include, but are not limited to, porphyrinic compounds as described in U.S. Pat. No. 4,720,432, plasma-deposited fluorocarbon polymers as described in U.S. Pat. No. 6,208,075, and some aromatic amines, for example, m-MTDATA (4,4',4"-tris[(3-ethylphenyl)phenylamino]triphenylamine). Alternative hole-injecting materials reportedly useful in organic EL devices are described in EP 0 891 121 A1 and EP 1 029 909 A1. In addition, a p-type doped organic layer is also useful for the HIL as described in U.S. Pat. No. 6,423,429. A p-type doped organic layer means that the layer is electrically conductive, and the charge carriers are primarily holes. The conductivity is provided by the formation of a charge-transfer complex as a result of hole transfer from the dopant to the host material.

The HTL in organic EL units contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen-containing group are disclosed by Brantley et al. U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The HTL can be formed of a single or a mixture of aromatic tertiary amine compounds. Illustrative of useful aromatic tertiary amines are the following:

1,1-Bis(4-di-p-tolylaminophenyl)cyclohexane;
1,1-Bis(4-di-p-tolylaminophenyl)-4-phenylcyclohexane;
N,N,N',N'-tetraphenyl-4,4'''-diamino-1,1':4', 1":4", 1'''-quaterphenyl;
Bis(4-dimethylamino-2-methylphenyl)phenylmethane;
1,4-bis[2-[4-[N,N-di(p-toly)amino]phenyl]vinyl]benzene (BDTAPVB);
N,N,N',N'-Tetra-p-tolyl-4,4'-diaminobiphenyl;
N,N,N',N'-Tetraphenyl-4,4'-diaminobiphenyl;
N,N,N',N'-tetra-1-naphthyl-4,4'-diaminobiphenyl;
N,N,N',N'-tetra-2-naphthyl-4,4'-diaminobiphenyl;
N-Phenylcarbazole;
4,4'-Bis[N-(1-naphthyl)-N-phenylamino]biphenyl (NPB);
4,4'-Bis[N-(1-naphthyl)-N-(2-naphthyl)amino]biphenyl (TNB);
4,4'-Bis[N-(1-naphthyl)-N-phenylamino]p-terphenyl;
4,4'-Bis[N-(2-naphthyl)-N-phenylamino]biphenyl;
4,4'-Bis[N-(3-acenaphthenyl)-N-phenylamino]biphenyl;
1,5-Bis[N-(1-naphthyl)-N-phenylamino]naphthalene;
4,4'-Bis[N-(9-anthryl)-N-phenylamino]biphenyl;
4,4'-Bis[N-(1-anthryl)-N-phenylamino]-p-terphenyl;
4,4'-Bis[N-(2-phenanthryl)-N-phenylamino]biphenyl;
4,4'-Bis[N-(8-fluoranthenyl)-N-phenylamino]biphenyl
4,4'-Bis[N-(2-pyrenyl)-N-phenylamino]biphenyl;
4,4'-Bis[N-(2-naphthacenyl)-N-phenylamino]biphenyl;
4,4'-Bis[N-(2-perylenyl)-N-phenylamino]biphenyl;
4,4'-Bis[N-(1-coronenyl)-N-phenylamino]biphenyl;
2,6-Bis(di-p-tolylamino)naphthalene;
2,6-Bis[di-(1-naphthyl)amino]naphthalene;
2,6-Bis[N-(1-naphthyl)-N-(2-naphthyl)amino]naphthalene;
N,N,N',N'-Tetra(2-naphthyl)-4,4"-diamino-p-terphenyl;
4,4'-Bis {N-phenyl-N-[4-(1-naphthyl)-phenyl]amino}biphenyl;
2,6-Bis[N,N-di(2-naphthyl)amino]fluorene;
4,4',4"-tris[(3-methylphenyl)phenylamino]triphenylamine (MTDATA); and
4,4'-Bis[N-(3-methylphenyl)-N-phenylamino]biphenyl (TPD).

Another class of useful hole-transporting materials includes polycyclic aromatic compounds as described in EP 1 009 041. Tertiary aromatic amines with more than two amine groups can be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

As more fully described in U.S. Pat. Nos. 4,769,292 and 5,935,721, the LEL in organic EL units includes a luminescent or fluorescent material where electroluminescence is produced as a result of electron hole pair recombination in this region. The LEL can be comprised of a single material, but more commonly includes a host material doped with a guest compound or compounds where light emission comes primarily from the dopant and can be of any color. The host materials in the LEL can be an electron-transporting material, a hole-transporting material, or another material or combination of materials that support hole electron recombination. The dopant is usually selected from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes, e.g., poly(p-phenylenevinylene), PPV, can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the electron energy band gap. For efficient energy transfer from the host to the dopant molecule, a necessary condition is that the band gap of the dopant is smaller than that of the host material. For phosphorescent emitters it is also important that the host triplet energy level of the host be high enough to enable energy transfer from host to dopant.

Host and emitting molecules known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine [alias, tris(8-quinolinolato) aluminum(III)];
CO-2: Magnesium bisoxine [alias, bis(8-quinolinolato) magnesium(II)];
CO-3: Bis[benzo{f}-8-quinolinolato]zinc (II);
CO-4: Bis(2-methyl-8-quinolinolato)aluminum(III)-$\mu$-oxo-bis(2-methyl-8-quinolinolato) aluminum(III);
CO-5: Indium trisoxine [alias, tris(8-quinolinolato)indium];
CO-6: Aluminum tris(5-methyloxine) [alias, tris(5-methyl-8-quinolinolato) aluminum(III)];
CO-7: Lithium oxine [alias, (8-quinolinolato)lithium(I)];
CO-8: Gallium oxine [alias, tris(8-quinolinolato)gallium (III)]; and
CO-9: Zirconium oxine [alias, tetra(8-quinolinolato)zirconium(IV)].

Other classes of useful host materials include, but are not limited to, derivatives of anthracene, such as 9,10-di-(2-naphthyl)anthracene and derivatives thereof as described in U.S. Pat. No. 5,935,721, distyrylarylene derivatives as described in U.S. Pat. No. 5,121,029, and benzazole derivatives, for example, 2,2', 2"-(1,3,5-phenylene)tris[1-phenyl-1H-benzimidazole]. Carbazole derivatives are particularly useful hosts for phosphorescent emitters.

Useful fluorescent dopants include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis (azinyl)methane compounds, and carbostyryl compounds.

Preferred thin film-forming materials for use in forming the ETL in the organic EL units of the present invention are metal chelated oxinoid compounds, including chelates of oxine itself, also commonly referred to as 8-quinolinol or 8-hydroxyquinoline. Such compounds help to inject and transport electrons, exhibit high levels of performance, and are readily deposited to form thin films. Exemplary oxinoid compounds were listed previously.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

An n-type doped organic layer is also useful for the ETL, for example, as described in U.S. Pat. No. 6,013,384. The n-type doped organic layer comprises a host organic material and at least one n-type dopant. The host material in the n-typed doped organic layer comprises a small molecule material or a polymeric material, or a combination thereof. It is preferred that this host material is selected from the aforementioned electron-transporting materials.

The materials used as the n-type dopants in the n-type doped ETL include metals or metal compounds having a work function less than 4.0 eV. Particularly useful dopants include alkali metals, alkali metal compounds, alkaline earth metals, and alkaline earth metal compounds. The term "metal compounds" includes organometallic complexes, metal-organic salts, and inorganic salts, oxides and halides. Among the class of metal-containing n-type dopants, Li, Na, K, Rb, Cs, Mg, Ca, Sr, Ba, La, Ce, Nd, Sm, Eu, Tb, Dy, or Yb, and their inorganic or organic compounds, are particularly useful. The materials used as the n-type dopants in the n-type doped organic layer of the intermediate connectors also include organic reducing agents with strong electron-donating properties. By "strong electron-donating properties" it is meant that the organic dopant should be able to donate at least some electronic charge to the host to form a charge-transfer complex with the host. Nonlimiting examples of organic molecules include bis(ethylenedithio)-tetrathiafulvalene (BEDT-TTF), tetrathiafulvalene (TTF), and their derivatives. In the case of polymeric hosts, the dopant can be any of the above or also a material molecularly dispersed or copolymerized with the host as a minor component. Upon doping with an appropriate n-type dopant, the doped organic layer would then exhibit primarily electron transport properties. The n-type doped concentration is preferably in the range of 0.01–20 vol. %.

While not always necessary, it is often useful to provide an EIL in the EL unit. The EIL can serve to facilitate injection of electrons into the ETL and to increase the electrical conductivity resulting in a low driving voltage of the tandem OLED. Suitable materials for use in the EIL are the aforementioned ETL's doped with strong reducing agents or low work-function metals (<4.0 eV). Alternative inorganic electron-injecting materials can also be useful in the organic EL unit, which will be described in following paragraph.

When light emission is viewed solely through the anode, the cathode 140 used in the present invention can be comprised of nearly any conductive material. Desirable materials have good film-forming properties to ensure good contact with the underlying organic layer, promote electron injection at low voltage, and have good stability. Useful cathode materials often contain a low work-function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprising a thin inorganic EIL in contact with an organic layer (e.g., ETL), which is capped with a thicker layer of a conductive metal. Here, the inorganic EIL preferably includes a low work-function metal or metal salt and, if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861, 5,059,862, and 6,140,763.

When light emission is viewed through the cathode, the cathode must be transparent or nearly transparent. For such applications, metals must be thin or one must use transparent conductive oxides, or include these materials. Optically transparent cathodes have been described in more detail in U.S. Pat. Nos. 4,885,211; 5,247,190; 5,703,436; 5,608,287; 5,837,391; 5,677,572; 5,776,622; 5,776,623; 5,714,838; 5,969,474; 5,739,545; 5,981,306; 6,137,223; 6,140,763; 6,172,459; 6,278,236; 6,284,393; JP 3,234,963; and EP 1 076 368. Cathode materials are typically deposited by thermal evaporation, electron beam evaporation, ion sputtering, or chemical vapor deposition. When needed, patterning can be achieved through many well known methods including, but not limited to, through-mask deposition, integral shadow masking, for example as described in U.S. Pat. No. 5,276, 380 and EP 0 732 868, laser ablation, and selective chemical vapor deposition.

In some instances, LEL and ETL in the organic EL units can optionally be collapsed into a single layer that serves the function of supporting both light emission and electron transportation. It is also known in the art that emitting dopants can be added to the HTL, which can serve as a host. Multiple dopants can be added to one or more layers in order to produce a white-emitting OLED, for example, by combining blue- and yellow-emitting materials, cyan- and red-emitting materials, or red-, green-, and blue-emitting materials. White-emitting devices are described, for example, in U.S. Patent Application Publication 2002/0025419 A1; U.S. Pat. Nos. 5,683,823; 5,503,910; 5,405,709; 5,283,182; EP 1 187 235; and EP 1 182 244.

Additional layers such as electron or hole-blocking layers as taught in the art can be employed in devices of the present invention. Hole-blocking layers are commonly used to improve efficiency of phosphorescent emitter devices, for example, as in U.S. Patent Application Publication 2002/0015859 A1.

The organic materials mentioned above are suitably deposited through a vapor-phase method such as thermal evaporation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by thermal evaporation can be vaporized from an evaporation "boat" often comprised of a tantalum material, e.g., as described in U.S. Pat. No. 6,237,529, or can be first coated onto a donor sheet and then sublimed in closer proximity to the substrate. Layers with a mixture of materials can utilize separate evaporation boats or the materials can be premixed and coated from a single boat or donor sheet. For full color display, the pixelation of LELs may be needed. This pixelated deposition of LELs can be achieved using shadow masks, integral shadow masks, U.S. Pat. No. 5,294,870, spatially defined thermal dye transfer from a donor sheet, U.S. Pat. Nos. 5,688,551, 5,851,709, and 6,066, 357, and inkjet method, U.S. Pat. No. 6,066,357. For other organic layers either in the organic EL units or in the intermediate connectors, pixelated deposition is not necessarily needed.

Most OLEDs are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

EXAMPLES

The following examples are presented for a further understanding of the present invention. For purposes of brevity, the materials and layers formed therefrom will be abbreviated as given below:

ITO: indium-tin-oxide; used in forming the transparent anode on glass substrates;

CFx: polymerized fluorocarbon layer; used in forming a hole-injecting layer on top of ITO;

NPB: N,N'-di(naphthalene-1-yl)-N,N'-diphenyl-benzidine; used in forming the hole-transporting layer in the organic EL unit;

Alq: tris(8-hydroxyquinoline) aluminum(III); used both as the host in forming the light-emitting layer and used as the host in forming the n-type doped electron-transporting layer in the organic EL unit;

C545T: 10-(2-benzothiazolyl)-1,1,7,7-tetramethyl-2,3,6,7-tetrahydro-1H, 5H,11H(1)benzopyrano(6,7,8-ij)quino-lizin-11-one; used as a green dopant in the light-emitting layer in the EL unit;

Li: Lithium; used as n-type dopant in forming the n-type doped electron-transporting layer in the organic EL unit; and Mg:Ag: magnesium:silver at a ratio of 10:0.5 by volume; used in forming the cathode.

In the following examples, the thickness of the organic layers and the doping concentrations were controlled and measured in situ using calibrated thickness monitors (INFICON IC/5 Deposition Controller). The EL characteristics of all the fabricated devices were evaluated using a constant current source (KEITHLEY 2400 SourceMeter) and a photometer (PHOTO RESEARCH SpectraScan PR 650) at the room temperature. The color will be reported using Commission Internationale de l'Eclairage (CIE) coordinates.

The preparation of a conventional OLED is as follows: A ~1.1 mm thick glass substrate coated with a transparent ITO conductive layer was cleaned and dried using a commercial glass scrubber tool. The thickness of ITO is about 42 nm and the sheet resistance of the ITO is about 68 $\Omega$/square. The ITO surface was subsequently treated with oxidative plasma to condition the surface as an anode. A layer of CFx, 1 nm thick, was deposited on the clean ITO surface as the HIL by decomposing $CHF_3$ gas in an RF plasma treatment chamber. The substrate was then transferred into a vacuum deposition chamber (TROVATO MFG. INC) for deposition of all other layers on top of the substrate. The following layers were deposited in the following sequence by evaporation from a heated boat under a vacuum of approximately $10^{-6}$ Torr:

1. EL unit:
   a) an HTL, about 90 nm thick, including NPB;
   b) a LEL, 30 nm thick, including Alq doped 1.0 vol. % C545T; and
   c) a first ETL, 30 nm thick, including Alq doped with 1.2 vol. % Li.
2. Cathode: approximately 210 nm thick, including MgAg.

After the deposition of these layers, the device was transferred from the deposition chamber into a dry box (VAC Vacuum Atmosphere Company) for encapsulation. The $EL_2$ performance of the device was measured at 20 $mA/cm^2$ and at the room temperature.

This conventional OLED requires a drive voltage of about 6.1 V to pass 20 $mA/cm^2$. Under this testing condition, the device has a luminance of 2110 $cd/m^2$, luminous efficiency of about 10.6 cd/A, and power efficiency of about 5.45 lm/W. Its CIEx and CIEy are 0.279, 0.651, respectively, with an emission peak at 520 nm.

EXAMPLE 2

Comparative

A tandem OLED was constructed in the manner described in Example 1, and the deposited layer structure is:
1. 1st EL Unit:
   a) an HTL, about 100 nm thick, including NPB;
   b) a LEL, 20 nm thick, including Alq doped 1.0 vol. % C545T; and
   c) a first ETL, 40 nm thick, including Alq doped with 1.2 vol. % Li.
2. 1st Intermediate Connector:
   a) a high work function metal layer, 10 nm thick, including Ag.
3. 2nd EL Unit:
   a) an HTL, about 70 nm thick, including NPB;
   b) a LEL, 20 nm thick, including Alq doped 1.0 vol. % C545T; and
   c) a first ETL, 40 nm thick, including Alq doped with 1.2 vol. % Li.
4. Cathode: approximately 210 nm thick, including MgAg.

This tandem OLED requires a drive voltage of about 22.9 V to pass 20 mA/cm$^2$. Under this testing condition, the device has a luminance of 937 cd/m$^2$, luminous efficiency of about 4.68 cd/A, and power efficiency of about 0.64 lm/W. Its CIEx and CIEy are 0.179, 0.689, respectively, with an emission peak at 516 nm. The drive voltage is almost four times as high as that of Example 1 at 20 mA/cm$^2$, and the luminous efficiency is less than a half of that of Example 1. It clearly indicates that a single layer of high work function metal cannot form a good intermediate connector in the tandem OLED. The extremely high drive voltage is due to the high injection barrier formed between the high work function layer and the EL units. The low luminous efficiency is due to the poor carrier injection between the intermediate connector and the EL units and due to the optical absorption of the thick metal layer.

EXAMPLE 3

Comparative

A tandem OLED was constructed in the manner described in Example 2, and the deposited layer structure is:
1. 1st EL Unit:
   a) an HTL, about 90 nm thick, including NPB;
   b) a LEL, 30 nm thick, including Alq doped 1.0 vol. % C545T; and
   c) a first ETL, 30 nm thick, including Alq doped with 1.2 vol. % Li.
2. 1st Intermediate Connector:
   a) a metal compound layer, 2 nm thick, including MoO$_3$.
3. 2nd EL Unit:
   a) an HTL, about 88 nm thick, including NPB;
   b) a LEL, 30 nm thick, including Alq doped 1.0 vol. % C545T; and
   c) a first ETL, 30 nm thick, including Alq doped with 1.2 vol. % Li.
4. Cathode: approximately 210 nm thick, including MgAg.

Figure 6:
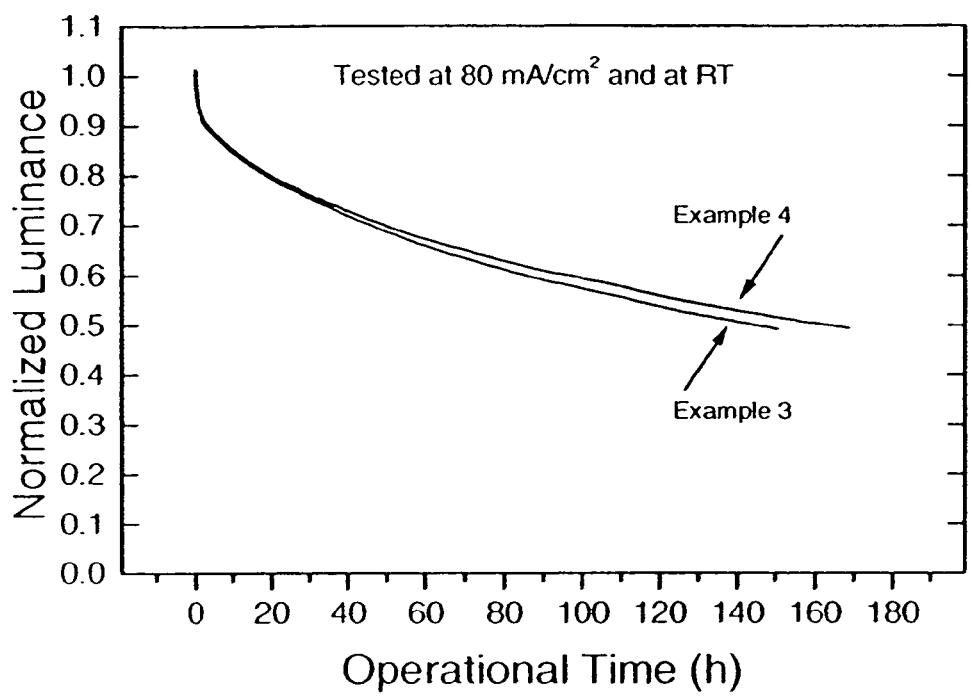
FIG. 6 is a graph of normalized luminance vs. operational time of the tandem OLEDs in accordance with the present invention as well as the reference device under a constant driving current density of 80 mA/cm$^2$ and at the room temperature.
Figure 7:
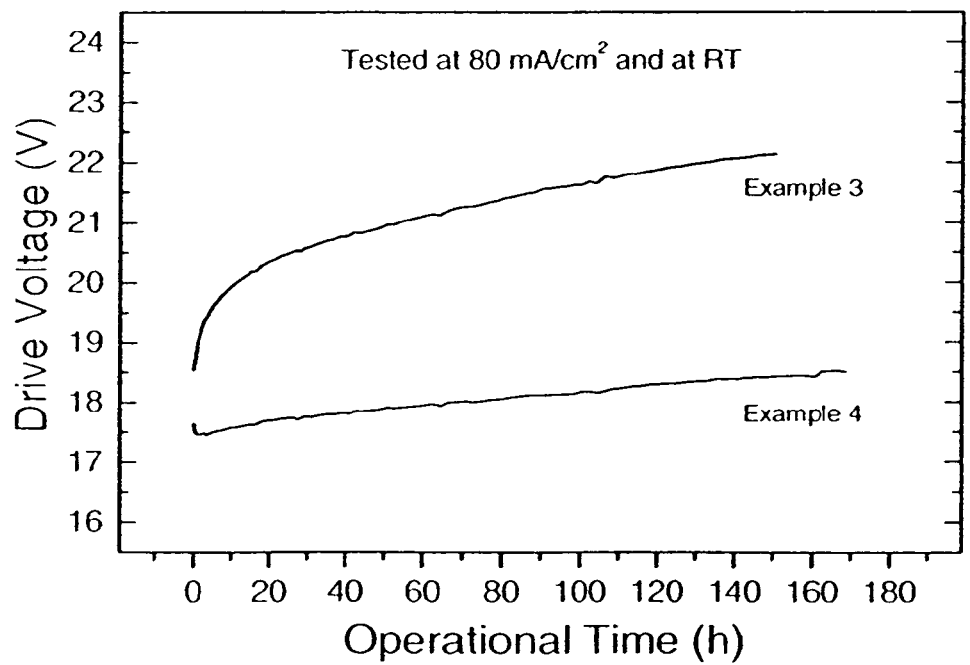
FIG. 7 is a graph of drive voltage vs. operational time of the tandem OLEDs in accordance with the present invention as well as the reference device under a constant driving current density of 80 mA/cm$^2$ and at the room temperature.

This tandem OLED requires a drive voltage of 14.3 V to pass 20 mA/cm$^2$. Under this testing condition, the device has a luminance of 4781 cd/m$^2$, luminous efficiency of about 23.9 cd/A, and power efficiency of about 5.24 lm/W. Its CIEx and CIEy are 0.267, 0.660, respectively, with an emission peak at 520 nm. The drive voltage is about 2.3 times as high as that of Example 1 at 20 mA/cm$^2$, and the luminous efficiency is also about 2.3 times as high as that of Example 1. It indicates that 2-nm-thick MoO$_3$ as a metal compound layer can form a good intermediate connector in the tandem OLED. The operational stability of the device has been tested at 80 mA/cm$^2$ and at the room temperature. The decrease of normalized luminance vs. the operational time is shown in FIG. 6, and the increase of drive voltage vs. the operational time is shown in FIG. 7. At 80 mA/cm$^2$, the initial luminance of the device is about 21,220 cd/m$^2$. When keeping this current density unchanged, its operational lifetime (defined as the operational time when 50% of its initial luminance has dropped) at that brightness is about 145 hours. If this device were tested at an initial luminance of 100 cd/m$^2$, its operational lifetime would be longer than 145×212.2=30,769 hours. However, when the voltage increase was examined during operation, the voltage increase between the initial value and the value after the device was driven to reach its lifetime is about 3.6 V (increased from 18.53 V to 22.13 V at 80 mA/cm$^2$). If the device is driven at a constant voltage scheme, its initial luminance will drop much faster than driven at the constant current scheme, and its lifetime will be much shorter accordingly. Therefore, although MoO$_3$ is a nontoxic material, it is not stable enough when it is used alone as an intermediate connector.

EXAMPLE 4

A tandem OLED was constructed with the same layer structure as Example 3, except in step 2 that the 1st intermediate connector is:
1) a high work function metal layer, 0.5 nm thick, including Ag; and
2) a metal compound layer, 2 nm thick, including MoO$_3$.

This tandem OLED requires a drive voltage of 13.4 V to pass 20 mA/cm$^2$. Under this testing condition, the device has a luminance of 4627 cd/M$^2$, luminous efficiency of about 23.1 cd/A, and power efficiency of about 5.43 lm/W. Its CIEx and CIEy are 0.270, 0.660, respectively, with an emission peak at 520 nm. The drive voltage is about 2.2 times as high as that of Example 1 at 20 mA/cm$^2$, and the luminous efficiency is about 2.2 times as high as that of Example 1. It indicates that Ag/MoO$_3$ bilayer can form a good intermediate connector in the tandem OLED. The operational stability of the device has been tested at 80 mA/cm$^2$ and at the room temperature. The decrease of normalized luminance vs. the operational time is shown in FIG. 6, and the increase of drive voltage vs. the operational time is shown in FIG. 7. At 80 mA/cm$^2$, the initial luminance of the device is about 20, 130 cd/m$^2$. When keeping this current density unchanged, its operational lifetime at that brightness is about 164 hours. If this device were tested at an initial luminance of 100 cd/m$^2$, its operational lifetime would be longer than 164×201.3=33,013 hours.

When comparing the performance of Example 4 with that of Example 3, the initial drive voltage of Example 4 at 20 mA/cm$^2$ is about 1 V lower resulting in higher power efficiency, and the lifetime is also longer. Moreover, when the voltage increase was examined during operation, the voltage increase between the initial value and the value after the device was driven to reach its lifetime is about 0.7 V (increased from 17.8 V to 18.5 V at 80 mA/cm$^2$). This voltage increase is much less than that of Example 3. If both Examples 3 and 4 are driven at a constant voltage scheme, Example 4 will have much longer lifetime than Example 3. Therefore, by incorporating a high work function metal layer with a metal compound layer, a stable intermediate connector can be formed. This stable intermediate connector will both reduce the initial drive voltage and improve the lifetime of the tandem OLED.

The invention has been described in detail with particular reference to certain preferred embodiments thereof, but it will be understood that variations and modifications can be effected within the spirit and scope of the invention.

PARTS LIST 100 tandem OLED
110 anode
120 EL unit
120.1 $1^{st}$ EL unit
120.2 $2^{nd}$ EL unit
120.(N-1) $(N-1)^{th}$ EL unit
120.N $N^{th}$ EL unit
130 intermediate connector
130.1 $1^{st}$ intermediate connector (or $1^{st}$ connector)
130.2 $2^{nd}$ intermediate connector (or $2^{nd}$ connector)
130.(N-1) $(N-1)^{th}$ intermediate connector (or $(N-1)^{th}$ connector)
140 cathode
150 voltage/current source
160 electrical conductors
220 EL unit
221 hole-transporting layer
222 light-emitting layer
223 electron-transporting layer
330 intermediate connector
331 low work function metal layer
332 high work function metal layer
333 metal compound layer
430 intermediate connector
431 n-type semiconductor layer
530 intermediate connector

The invention claimed is:

1. A tandem OLED comprising:
   a) an anode;
   b) a cathode;
   c) a plurality of organic electroluminescent units disposed between the anode and the cathode, wherein each organic electroluminescent unit includes at least one light-emitting layer; and
   d) an intermediate connector disposed between each adjacent organic electroluminescent unit, wherein the intermediate connector includes at least a high work function metal layer having a work function of no less than 4.0 eV and a metal compound layer, wherein the intermediate connector has a sheet resistance of higher than 100 kΩ per square, wherein the intermediate connector is unpatterned, and wherein the high work function metal layer improves the operational stability of the OLED.

2. The tandem OLED of claim 1 wherein each organic electroluminescent unit includes at least a hole-transporting layer, a light-emitting layer, and an electron-transporting layer, and wherein each intermediate connector includes, in sequence, a low work function metal layer having a work function of less than 4.0 eV disposed adjacent to the electron-transporting layer in the organic electroluminescent unit, a high work function metal layer having a work function of no less than 4.0 eV, and a metal compound layer, wherein the intermediate connector has a sheet resistance of higher than 100 kΩ per square, and wherein the high work function metal layer improves the operational stability of the OLED.

3. The tandem OLED of claim 1 wherein each organic electroluminescent unit includes at least a hole-transporting layer, a light-emitting layer, and an electron-transporting layer, and wherein each intermediate connector includes, in sequence, an n-type semiconductor layer disposed adjacent to the electron-transporting layer in the organic electroluminescent unit, a high work function metal layer having a work function of no less than 4.0 eV, and a metal compound layer, wherein the intermediate connector has a sheet resistance of higher than 100 kΩ per square, and wherein the high work function metal layer improves the operational stability of the OLED.

4. The tandem OLED of claim 1 wherein each organic electroluminescent unit includes at least a hole-transporting layer, a light-emitting layer, and an electron-transporting layer, and wherein the electron-transporting layer is an n-type doped organic layer, and wherein each intermediate connector includes, in sequence, a high work function metal layer having a work function of no less than 4.0 eV disposed adjacent to the electron-transporting layer of the organic electroluminescent unit and a metal compound layer, wherein the intermediate connector has a sheet resistance of higher than 100 kΩ per square, and wherein the high work function metal layer improves the operational stability of the OLED.

5. The tandem OLED of claim 1 wherein the thickness of the high work function metal layer in the intermediate connector is in the range of from 0.1 nm to 5.0 nm.

6. The tandem OLED of claim 1 wherein the thickness of the high work function metal layer in the intermediate connector is in the range of from 0.2 nm to 2.0 nm.

7. The tandem OLED of claim 1 wherein the thickness of the metal compound layer in the intermediate connector is in the range of from 0.5 nm to 20 nm.

8. The tandem OLED of claim 1 wherein the thickness of the metal compound layer in the intermediate connector is in the range of from 1.0 nm to 5 nm.

9. The tandem OLED of claim 2 wherein the thickness of the low work function metal layer in the intermediate connector is in the range of from 0.1 nm to 10 nm.

10. The tandem OLED of claim 2 wherein the thickness of the low work function metal layer in the intermediate connector is in the range of from 0.2 nm to 2.0 nm.

11. The tandem OLED of claim 3 wherein the thickness of the n-type semiconductor layer in the intermediate connector is in the range of from 0.5 nm to 20 nm.

12. The tandem OLED of claim 3 wherein the thickness of the n-type semiconductor layer in the intermediate connector is in the range of from 1.0 nm to 5.0 nm.

13. The tandem OLED of claim 1 wherein the intermediate connector has at least 75% optical transmission in the visible region of the spectrum.

14. The tandem OLED of claim 1 wherein the high work function metal layer includes Ti, Zr, Ti, Nb, Ta, Cr, Mo, W, Re, Fe, Ru, Os, Co, Rh, Ir, Ni, Pd, Pt, Cu, Ag, Au, Zn, Al, In, or Sn.

15. The tandem OLED of claim 1 wherein the high work function metal layer includes Ag, Al, Cu, Au, Zn, In, or Sn.

16. The tandem OLED of claim 1 wherein the high work function metal layer includes Ag or Al.

17. The tandem OLED of claim 1 wherein the metal compound layer is selected from the stoichiometric oxides or nonstoichiometric oxides of titanium, zirconium, hafnium, niobium, tantalum, molybdenum, tungsten, manganese, iron, ruthenium, rhodium, iridium, nickel, palladium, platinum, copper, zinc, silicon, or germanium, or combinations thereof.

18. The tandem OLED of claim 1 wherein the metal compound layer is selected from the stoichiometric sulfides or nonstoichiometric sulfides of titanium, zirconium, hafnium, niobium, tantalum, molybdenum, tungsten, manganese, iron, ruthenium, rhodium, iridium, nickel, palladium, platinum, copper, silicon, or germanium, or combinations thereof.

19. The tandem OLED of claim 1 wherein the metal compound layer is selected from the stoichiometric selenides or nonstoichiometric selenides of titanium, zirconium, hafnium, niobium, tantalum, molybdenum, tungsten, manganese, iron, ruthenium, rhodium, iridium, nickel, palladium, platinum, copper, silicon, or germanium, or combinations thereof.

20. The tandem OLED of claim 1 wherein the metal compound layer is selected from the stoichiometric tellurides or nonstoichiometric tellurides of titanium, zirconium, hafnium, niobium, tantalum, molybdenum, tungsten, manganese, iron, ruthenium, rhodium, iridium, nickel, palladium, platinum, copper, silicon, or germanium, or combinations thereof.

21. The tandem OLED of claim 1 wherein the metal compound layer is selected from the stoichiometric nitrides or nonstoichiometric nitrides of titanium, zirconium, hafnium, niobium, tantalum, molybdenum, tungsten, manganese, iron, ruthenium, rhodium, iridium, nickel, palladium, platinum, copper, zinc, gallium, silicon, or germanium, or combinations thereof.

22. The tandem OLED of claim 1 wherein the metal compound layer is selected from the stoichiometric carbides or nonstoichiometric carbides of titanium, zirconium, hafnium, niobium, tantalum, molybdenum, tungsten, manganese, iron, ruthenium, rhodium, iridium, nickel, palladium, platinum, copper, zinc, aluminum, silicon, or germanium, or combinations thereof.

23. The tandem OLED of claim 1 wherein the metal compound layer is selected from $MoO_3$, $NiMoO_4$, $CuMoO_4$, $WO_3$, ZnTe, $Al_4C_3$, $AlF_3$, $B_2S_3$, CuS, GaP, InP, or SnTe.

24. The tandem OLED of claim 1 wherein the metal compound layer is selected from $MoO_3$, $NiMoO_4$, $CuMoO_4$, or $WO_3$.

25. The tandem OLED of claim 2 wherein the low work function metal layer includes Li, Na, K, Rb, Cs, Mg, Ca, Sr, Ba, La, Ce, Nd, Sm, Eu, Tb, Dy, or Yb.

26. The tandem OLED of claim 2 wherein the low work function metal layer includes Li, Na, Cs, Ca, Ba, or Yb.

27. The tandem OLED of claim 3 wherein the n-type semiconductor layer includes ZnSe, ZnS, ZnSSe, SnSe, SnS, SnSSe, $LaCuO_3$, or $La_4Ru_6O_{19}$.

28. The tandem OLED of claim 3 wherein the n-type semiconductor layer includes ZnSe or ZnS.

* * * * *